(12) United States Patent
Yan et al.

(10) Patent No.: US 10,573,691 B2
(45) Date of Patent: Feb. 25, 2020

(54) DISPLAY BACKBOARD, METHOD FOR FABRICATING THE SAME, AND DISPLAY DEVICE

(71) Applicant: BOE TECHNOLOGY GROUP CO., LTD., Beijing (CN)

(72) Inventors: Guang Yan, Beijing (CN); Chinlung Liao, Beijing (CN); Dongfang Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/991,146

(22) Filed: May 29, 2018

(65) Prior Publication Data

US 2019/0165051 A1 May 30, 2019

(30) Foreign Application Priority Data

Nov. 29, 2017 (CN) .......................... 2017 1 1226382

(51) Int. Cl.
  *H01L 27/32* (2006.01)
  *H01L 51/52* (2006.01)
(52) U.S. Cl.
  CPC ...... *H01L 27/3211* (2013.01); *H01L 27/3209* (2013.01); *H01L 51/5262* (2013.01); *H01L 51/5203* (2013.01); *H01L 2251/558* (2013.01)
(58) Field of Classification Search
  CPC ............. H01L 27/3211; H01L 27/3213; H01L 27/3218; H01L 51/5203; H01L 51/5265
  See application file for complete search history.

(56) References Cited

U.S. PATENT DOCUMENTS

| 8,309,947 | B2 | 11/2012 | Vaufrey | |
|---|---|---|---|---|
| 9,450,028 | B2 * | 9/2016 | Chou | .................. H01L 27/3211 |
| 2005/0280362 | A1 * | 12/2005 | Shore | .................. H01L 51/5265 |
| | | | | 313/506 |

(Continued)

FOREIGN PATENT DOCUMENTS

| CN | 1592525 A | 3/2005 |
|---|---|---|
| CN | 101138107 A | 3/2008 |
| CN | 105609534 A | 5/2016 |

OTHER PUBLICATIONS

Chan, J. "Cavity design and optimization for organic microcavity OLEDs" Proc. Of SPIE Jan. 17, 2006 pp. 603824-1-603824-9 (Year: 2006).*

(Continued)

*Primary Examiner* — Grant S Withers
(74) *Attorney, Agent, or Firm* — Calfee, Halter & Griswold LLP

(57) ABSTRACT

The present disclosure provides a display backboard, a method for fabricating the same and a display device. The display backboard includes a plurality of pixel units arranged in an array, each of the pixel units includes a plurality of sub-pixels, and each of the sub-pixels includes a substrate, a first electrode, a light emitting layer, and a second electrode stacked in sequence. The plurality of the sub-pixels have different emission colors, and thicknesses of the first electrodes among the plurality of the sub-pixels are different, and the thickness of the first electrode is configured so that an emission dipole of the sub-pixel is located at a second anti-node of standing wave on the first electrode side.

14 Claims, 3 Drawing Sheets

(56) References Cited

U.S. PATENT DOCUMENTS

2014/0353635 A1    12/2014  Chou et al.
2016/0163772 A1*  6/2016  Wu ..................... H01L 51/5012
                                                                     257/40
2018/0212183 A1*  7/2018  Ma ..................... H01L 51/5212

OTHER PUBLICATIONS

Chakaroun, M. "Experimental and Theoretical Study of the Optical Properties Optimization of an OLED in a Microcavity" IEEE Trans. On Elec. Dev. vol. 65 No. 11 Nov. 2018 pp. 4897-4904 (Year: 2018).*

Ceons, A. "Experimental optimization of the optical and electrical properties of a half-wavelength-thick organic hetero-structure in a Micro-cavity" Opt. Express Dec. 31, 2012 pp. 29252-1-29252-9 (Year: 2012).*

First Office Action for Chinese Patent Application No. 201711226382.X dated Jan. 30, 2019.

\* cited by examiner

DISPLAY BACKBOARD, METHOD FOR FABRICATING THE SAME, AND DISPLAY DEVICE

CROSS REFERENCE

The present application claims the priority of Chinese Patent Application No. 201711226382.X, filed on Nov. 29, 2017, and the entire contents thereof are incorporated herein by reference as part of the present application.

TECHNICAL FIELD

The present disclosure relates to the field of display technology, in particular, to a display backboard, a method for fabricating the same, and a display device.

BACKGROUND

Currently, in order to achieve the advantages of high material utilization and low manufacturing cost of organic light-emitting diodes (OLEDs), many different sub-pixels need to be fabricated by multiple solution printing processes. However, the OLED printed by the solution is not able to freely adjust the thickness of a functional layer as that in the OLED fabricated by evaporation process due to the limitations of the solubility of the material in the solvent, the height of the partition wall, and the hydrophobic characteristics, thereby causing the application of the printing process to be greatly limited.

SUMMARY

An aspect of the present disclosure provides a display backboard.

According to an embodiment of the present disclosure, the display backboard includes a plurality of pixel units arranged in an array, each of the pixel units comprising a plurality of sub-pixels, and each of the sub-pixels comprising a substrate, a first electrode, a light emitting layer, and a second electrode stacked in sequence. The plurality of the sub-pixels have different emission colors, and thicknesses of the first electrodes among the plurality of the sub-pixels are different, and the thickness of the first electrode is configured so that an emission dipole of the sub-pixel is located at a second anti-node of standing wave on the first electrode side.

In addition, the display backboard according to the above embodiment of the present disclosure may have the following additional technical features.

According to an embodiment of the present disclosure, the plurality of the sub-pixels include a red sub-pixel, a green sub-pixel, and a blue sub-pixel, and emission dipoles of the red sub-pixel, the green sub-pixel, and the blue sub-pixel are located at the respective second anti-nodes of standing wave on the first electrode side.

According to an embodiment of the present disclosure, the display backboard may further include a first organic functional layer disposed between the first electrode and the light emitting layer and a second organic functional layer disposed between the second electrode and the light emitting layer.

According to an embodiment of the present disclosure, in the plurality of the sub-pixels, the plurality of the first organic functional layers are the same in thickness.

According to an embodiment of the present disclosure, the thickness of the first electrode is 135-145 nm in the red sub-pixel; the thickness of the first electrode is 85-95 nm in the green sub-pixel; and the thickness of the first electrode is 65-75 nm in the blue sub-pixel.

According to an embodiment of the present disclosure, the first organic functional layer may include: a first sub-layer, the plurality of the first sub-layers among the plurality of the sub-pixels being the same in thickness; and a second sub-layer disposed on a side of the first sub-layer away from the first electrode, the plurality of the second sub-layers among the plurality of the sub-pixels being the same in thickness.

According to an embodiment of the present disclosure, the second organic functional layer may include: a third sub-layer, the plurality of the third sub-layers among the plurality of the sub-pixels being the same in thickness; and a fourth sub-layer, the plurality of the fourth sub-layers being disposed on a side of the third sub-layer away from the light emitting layer and the plurality of the fourth sub-layers among the plurality of the sub-pixels being the same in thickness.

According to an embodiment of the present disclosure, the display backboard includes a plurality of pixel units arranged in an array; each of the pixel units includes a plurality of sub-pixels; and each of the sub-pixels is formed by the following steps.

A first electrode is formed on a side of a substrate.

A light emitting layer is formed on a side of the first electrode away from the substrate.

A second electrode is formed on a side of the light emitting layer away from the substrate.

The plurality of the sub-pixels have different emission colors, and thicknesses of the first electrodes among the plurality of the sub-pixels are different, and the thickness of the first electrode is configured so that an emission dipole of the sub-pixel is located at a second anti-node of standing wave on the first electrode side.

In addition, according to the fabricating method of the above embodiment of the present disclosure, the method may include the following additional technical features.

According to an embodiment of the present disclosure, the plurality of the first electrodes with different thicknesses among the plurality of the sub-pixels is formed by a single patterning process using a gray scale mask.

According to an embodiment of the present disclosure, the steps for forming the light emitting layer includes as follows.

A first organic functional layer is formed on a side of the first electrode away from the substrate.

The light emitting layer is formed on a side of the first organic functional layer away from the substrate.

According to an embodiment of the present disclosure, the steps for forming the second electrode includes as follows.

A second organic functional layer is formed on a side of the light emitting layer away from the substrate The second electrode is formed on a side of the second organic functional layer away from the substrate.

According to an embodiment of the present disclosure, the first organic functional layer and the light emitting layer are formed by a solution method; and, in the plurality of the sub-pixels, the plurality of the first organic functional layers are the same in thickness.

According to an embodiment of the present disclosure, the steps for forming the first organic functional layer includes as follows.

A first sub-layer is formed and the plurality of the first sub-layers among the plurality of the sub-pixels are the same in thickness.

A second sub-layer is formed on a side of the first sub-layer away from the first electrode and the plurality of the second sub-layers among the plurality of the sub-pixels are the same in thickness.

According to an embodiment of the present disclosure, the plurality of the sub-pixels include a red sub-pixel, a green sub-pixel, and a blue sub-pixel, and emission dipoles of the red sub-pixel, the green sub-pixel, and the blue sub-pixel are located at the respective second anti-nodes of standing wave on the first electrode side.

According to an embodiment of the present disclosure, the display backboard further includes: a first organic functional layer disposed between the first electrode and the light emitting layer; and a second organic functional layer disposed between the second electrode and the light emitting layer.

According to an embodiment of the present disclosure, in the plurality of the sub-pixels, the plurality of the first organic functional layers are the same in thickness.

According to an embodiment of the present disclosure, the thickness of the first electrode is 135-145 nm in the red sub-pixel; the thickness of the first electrode is 85-95 nm in the green sub-pixel; and the thickness of the first electrode is 65-75 nm in the blue sub-pixel.

An aspect of the present disclosure provides a display device.

According to an embodiment of the present disclosure, the display device includes the above mentioned display backboard.

The additional aspects and advantages of the present disclosure will be given from the following description, some of which will be apparent from the following description or be known by practice of the present disclosure.

BRIEF DESCRIPTION OF THE DRAWINGS

The above and/or additional aspects and advantages of the present disclosure will become apparent and easily understood from the following description of embodiments in conjunction with the accompanying drawings, in which.

DETAILED DESCRIPTION

The embodiments of the present disclosure are described in detail below, and it will be understood by those skilled in the art that the following embodiments are intended to explain the present disclosure and should not be construed as limiting the present disclosure. Unless otherwise specified, the specific techniques or conditions that are not explicitly described in the following examples can be performed by those skilled in the art according to commonly used technologies or conditions in the art or according to product specifications.

In one aspect of the present disclosure, the present disclosure provides a display backboard. The display backboard of the present disclosure will be described in detail with reference to FIGS. 1 to 3.

Figure 1:
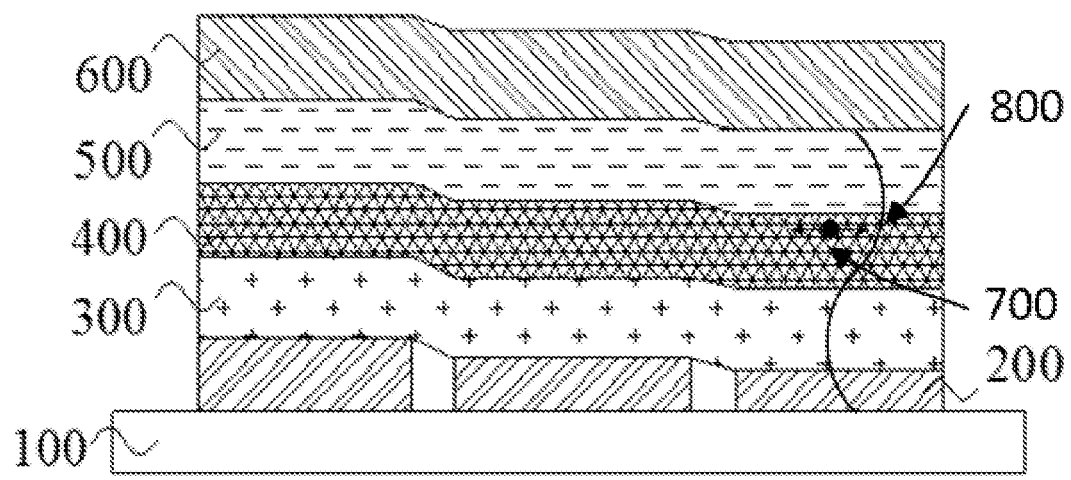
FIG. 1 is a schematic diagram illustrating a structure of a display backboard according to an embodiment of the present disclosure.

According to an embodiment of the present disclosure, referring to FIG. 1, the display backboard includes a plurality of pixel units arranged in an array; each of the pixel units includes a plurality of sub-pixels; and each of the sub-pixels includes a substrate 100, a first electrode 200, a first organic functional layer 300, a light emitting layer 400, a second organic functional layer 500, and a second electrode 600 stacked in sequence. The plurality of the sub-pixels have different emission colors, and thicknesses of the first electrodes 200 among the plurality of the sub-pixels are different. The thickness of the first electrode 200 and the thickness of the first organic functional layer 300 are used to enable an emission dipole 800 of the sub-pixel to be located at a second anti-node of standing wave 700 on the first electrode side.

The inventors of the present application have found through long-term research that although the emission dipoles of different sub-pixels can be placed on the node on the second electrode side by adjusting the thicknesses of the first organic functional layers 300 in different sub-pixels, it requires many times of print processes if the first organic functional layers 300 formed by solution printing are different in thickness, resulting in the complication of the fabricating process, affecting the production efficiency, and increasing the production cost. However, the inventors of the present application can set the emission dipoles of different sub-pixels to be placed at the respective second anti-nodes of standing wave only by setting the first electrodes 200 with different thicknesses, thereby effectively improving the extraction efficiency of the display backboard. In addition, the first electrodes 200 with different thicknesses may be formed by a single patterning process using a gray scale mask, which results in that the layers other than the first electrode 200 and the light emitting layer 400 in the display backboard may also be uniform in thickness and can be formed in a single process, thus improving the complexity of the process and increasing the luminous efficiency of the device.

According to an embodiment of the present disclosure, since the emission dipoles of different sub-pixels can be located at the respective second anti-nodes of standing wave by setting the first dipoles 200 with different thicknesses, there is no need to adjust the first organic functional layer 300 and the second organic functional layer 500 to enable the emission dipoles of different sub-pixels to be located at the respective second anti-nodes of standing wave. Therefore, in some specific embodiments, the first organic functional layer 300 and/or the second organic functional layer 500 may be omitted according to actual needs.

Figure 2:
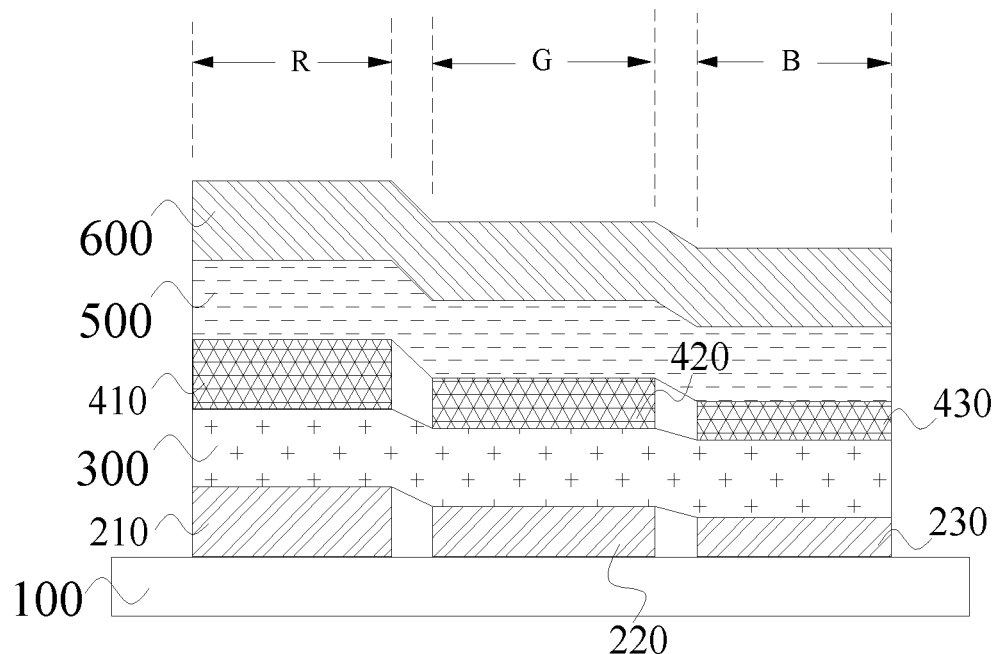
FIG. 2 is a schematic diagram illustrating a structure of a display backboard according to another embodiment of the present disclosure.

According to an embodiment of the present disclosure, referring to FIG. 2, the plurality of the sub-pixels includes a red sub-pixel R, a green sub-pixel and a blue sub-pixel B, and emission dipoles of the red sub-pixel R, the green sub-pixel and the blue sub-pixel B are located at the second anti-node of standing wave on the first electrode side. During the research, the inventor of the present application also found that, when the emission dipole of the red sub-pixel R is set at the first anti-node of standing wave, there is a problem that the film thickness of the red sub-pixel G device is too thin and electric leakage may easily occur. This will affect the yield of the display backboard. Therefore, the inventors of the present application set the emission dipoles of the red sub-pixel R, the green sub-pixel and the blue sub-pixel B to be placed at the respective second anti-nodes of standing wave, so that the problem that the film thickness of the red sub-pixel G device is too thin and electric leakage may easily occur can be avoided, thus, the extraction efficiency of the display backboard can be improved, and the yield of the display backboard can also be improved.

According to an embodiment of the present disclosure, in the plurality of sub-pixels, the plurality of first organic functional layers 300 may be the same in thickness, the plurality of second organic functional layers 500 may be the same in thickness, and the plurality of second electrodes 600 may also be the same in thickness. In this way, the first organic functional layer 300, the second organic functional layer 500, and the second electrode 600 are uniform in thickness respectively and can be formed through a single process, thus improving the complexity of the process and reducing the manufacturing cost.

According to the embodiments of the present disclosure, the specific materials of the first electrode 200 and the second electrode 600 are not particularly limited, and the conductive materials of electrodes commonly used in the art can be used. Those skilled in the art can design according to the specific emitting mode of the display backboard accordingly. In some embodiments of the present disclosure, the first electrode 200 may be a transparent conductive Indium Tin Oxide (ITO) material, and the second electrode 600 may be an opaque metal material, which results in a higher luminescence efficiency for the display device using the bottom emitting mode.

According to the embodiments of the present disclosure, the specific thickness of the first electrode 200 in the red sub-pixel R, the green sub-pixel and the blue sub-pixel B is not particularly limited, and can be designed and adjusted accordingly by those skilled in the art according to specific transmittance distorted point of the first electrode material. In some embodiments of the present disclosure, referring to FIG. 2, in the red sub-pixel R, the thickness of the first electrode 210 is 135-145 nm; in the green sub-pixel the thickness of the first electrode 220 is 85-95 nm; in the blue sub-pixel B, the thickness of the first electrode 230 is 65-75 nm. In some specific examples, in the red sub-pixel R, the thickness of the first electrode 210 is 140 nm; in the green sub-pixel the thickness of the first electrode 220 is 90 nm; and in the blue sub-pixel B, the thickness of the first electrode 230 is 70 nm.

The inventors of the present application have found through research that the ITO material first electrodes 200 with different thicknesses have different distortion points for the transmittance curves of light with different wavelengths. For the blue wavelength band (center wavelength is 450 nm), the ITO material first electrode 230 with a thickness of 65-75 nm has a better transmittance, and the light transmittance is optimal at the thickness of 70 nm, which results in a higher efficiency and a longer lifetime for blue light; for the green wavelength band (center wavelength is 530 nm), the ITO material first electrode 220 with a thickness of 85-95 nm has a better transmittance, and the light transmittance is optimal at the thickness of 90 nm, which results in that the efficiency is higher and the lifetime is longer for green light, and that a higher yield and a 20 nm etching depth with a better process stability can be obtained through the gray-scale masking method; and for the red wavelength band (the center wavelength is 610 nm), the ITO material first electrode 210 with a thickness of 135-145 nm has a better transmittance, and the light transmittance is optimal at the thickness of 130 nm, which results in that the efficiency is higher and the lifetime is longer for red light, and that a higher yield and a 20 nm and a 50 nm etching depths with a better process stability can be obtained through the gray-scale masking method. In addition, using the first electrodes 200 with the above-described various thicknesses, the performance of the device can be improved and the power consumption of the device can be reduced, while the first electrode 200 with this thickness also has good electrical conductivity.

According to the embodiments of the present disclosure, the specific thickness of the light emitting layer 400 is not particularly limited and can be designed accordingly by those skilled in the art according to the specific luminescence efficiency of the luminescent material. In some embodiments of the present disclosure, referring to FIG. 2, in the red sub-pixel R, the thickness of the light emitting layer 410 is 64 nm; in the green sub-pixel the thickness of the light emitting layer 420 is 60 nm; and in the blue sub-pixel B, the thickness of the light emitting layer 430 is 38 nm.

The inventors of the present application have found that the thickness of each layer formed by the solution method is not arbitrary and the material composition may affect the thickness and the uniformity of the film formation, and the thickness may in turn affect the efficiency and voltage of the device, and all of these can affect the lifetime of the device. The inventors have optimized the thicknesses of the plurality of light emitting layers 400, the optimal thickness of the light emitting layer 410 of the red sub-pixel R is 64 nm, the optimal thickness of the light emitting layer 420 of the green sub-pixel R is 60 nm, and the optimal thickness of the light emitting layer 430 of the blue sub-pixel B is 38 nm. In this way, the light emitting layer 400 of different sub-pixels has the optimal luminescence efficiency and the longest lifetime.

According to an embodiment of the present disclosure, the specific material of the light emitting layer 400 in the red sub-pixel R, the green sub-pixel and the blue sub-pixel B is not particularly limited as long as the sub-pixel formed by the material can be fabricated by the solution method, and can be chosen by those skilled in the art according to the specific functional requirements of the display backboard and the specific process requirements of the solution method, which will not be described here.

According to the embodiments of the present disclosure, the specific structure of the first organic functional layer 300 is not particularly limited and can be designed by those skilled in the art according to the specific functional requirements of the display backboard. In some embodiments of the present disclosure, the first organic functional layer 300 may include a first sub-layer and a second sub-layer. The second sub-layer is disposed on a side of the first sub-layer away from the first electrode 200, and in the plurality of sub-pixels, the plurality of first sub-layers are the same in thickness, and the plurality of second sub-layers are the same in thickness. In this way, the two types of the respective sub-layers of the first organic functional layer are uniform in thickness and can be fabricated through a single process, which can improve the complexity of the process and reduce the production cost.

Figure 3:
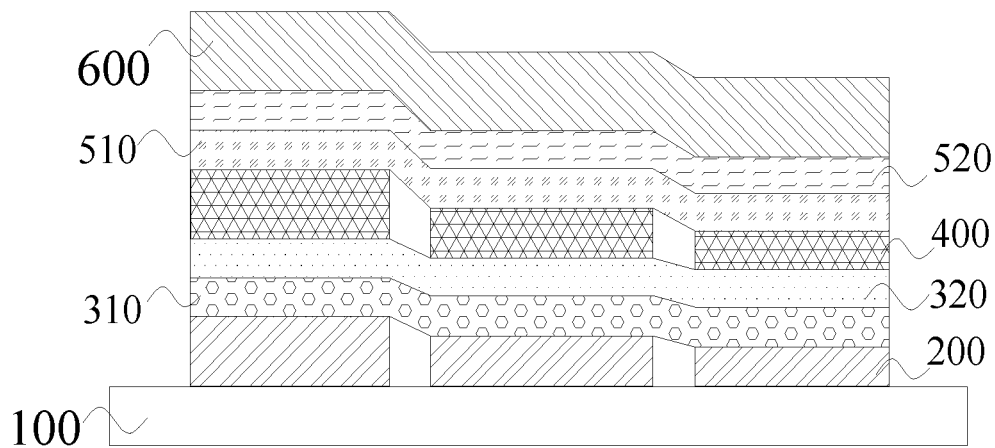
FIG. 3 is a schematic diagram illustrating a structure of a display backboard according to another embodiment of the present disclosure.

In some specific examples, referring to FIG. 3, the first sub-layer may be a hole injection layer (HIL) 310, the second sub-layer may be a hole transport layer (HTL) 320, and the hole transport layer 320 is disposed on a side of the hole injection layer 310 that is away from the first electrode

200. In the plurality of sub-pixels, the plurality of hole injection layers 310 have the same thickness and the plurality of hole transport layers 320 have the same thickness. In this way, an OLED display backboard with a better structure and function can be obtained, and organic functional sub-layers are uniform in thickness and can be fabricated through a single solution method, thereby improving the complexity of the process and reducing the production cost.

The inventors of the present application have also found that although the HIL and the HTL of different sub-pixels can be set to be with different thicknesses, it requires many times of printing if the HILs formed through solution printing method are different in thickness, thereby complicating the manufacturing process, affecting the production efficiency, and increasing production cost. However, the present application can set the emission dipoles of different sub-pixels to be placed at the second anti-nodes of standing wave on the respective first electrode sides only by setting the first electrodes 200 with different thicknesses, the plurality of the first electrode 200 can be formed through a single process using a gray scale mask, and the HIL and HTL can be formed respectively through a single process, thus improving the complexity of the process and increasing the luminous efficiency of the device.

According to embodiments of the present disclosure, the specific thicknesses of the hole injection layer 310 and the hole transport layer 320 are not particularly limited, and can be designed accordingly by those skilled in the art according to the total optical path of the second anti-nodes of standing wave on the first electrode sides of different sub-pixels and the specific thicknesses of the first electrodes 200. In some embodiments of the present disclosure, in the plurality of sub-pixels, the plurality of hole injection layers 310 have a thickness of 100 nm, and the plurality of hole transport layers 320 have a thickness of 85 nm. In this way, using the first organic functional sub-layers with the various thicknesses described above, a certain total optical path can be formed together with the first electrode 200 so that the emission dipoles of different sub-pixels can be disposed on the respective second anti-nodes of standing wave on the first electrode sides, thereby, the high light extracting rate of the display backboard can be realized and the thickness of the hole transport layer 320 is reduced from the existing 175 nm to 85 nm, so as to achieve the optimal process for forming the HTL with the solution process, thereby facilitating the hole transfer layer 320 to be uniform and at the same time the lifetime of the device to be longer; furthermore, the film-forming uniformity of the hole injection layer 310 is optimal at the thickness of 100 nm, and the uniformity may be reduced in the case when the thickness is too small or too large.

In other specific examples, the first sub-layer may be an electron injection layer (EIL), the second sub-layer may be an electron transport layer (ETL), and the electron transport layer is disposed on the side of the electron injection layer away from the first electrode 200. In the plurality of sub-pixels, the plurality of electron injection layers are the same in thickness, and the plurality of electron transport layers are the same in thickness. In this way, the respective sub-layers of the first organic functional layer are uniform in thickness and can be produced by a single evaporation method, thereby improving the complexity of the process and reducing the production cost.

According to the embodiments of the present disclosure, the specific structure of the second organic functional layer 500 is not particularly limited and can be designed accordingly by those skilled in the art according to the specific functional requirements of the display backboard. In some embodiments of the present disclosure, referring to FIG. 3, the second organic functional layer 500 (not shown in the figure) may include an electron transport layer (ETL) 510 and an electron injection layer (EIL) 520. The electron injection layer 520 is disposed on the side of the electron transport layer 510 that is away from the light emitting layer 400. In the plurality of sub-pixels, the plurality of the electron transport layers 510 are the same in thickness, and the plurality of electron injection layers 520 are the same in thickness. In this way, an OLED display backboard with better structure and function can be obtained, and the organic functional sub-layers are uniform in thickness and can be produced by a single evaporation method, thereby improving the complexity of the process and reducing the production cost. In other embodiments of the present disclosure, the second organic functional layer 500 may include a hole transport layer and a hole injection layer, and the hole injection layer is disposed on a side of the hole transport layer away from the light-emitting layer. In the plurality of sub-pixels, the plurality of hole transport layers are the same in thickness, and the plurality of hole injection layers are the same in thickness. In this way, an OLED display backboard with better structure and function can be obtained, and the respective organic functional sub-layers are uniform in thickness and can be produced by a single solution method, thereby improving the complexity of the process and reducing the production cost.

According to the embodiments of the present disclosure, the specific thicknesses of the electron transport layer 510 and the electron injection layer 520 are not particularly limited, and can be designed by those skilled in the art according to the anti-node of standing wave conditions on the second electrode sides of different sub-pixels and the electrical properties of the electron transport layer 510 and the electron injection layer 520. In some embodiments of the present disclosure, in the plurality of sub-pixels, the thickness of the plurality of electron transport layers 510 is 20 nm, and the thickness of the plurality of electron injection layers 520 is 1 nm. In this way, the second organic functional sub-layer with the above thickness can meet the standing wave condition on the second electrode side.

According to embodiments of the present disclosure, the specific materials of the hole injection layer 310, the hole transport layer 320, the electron transport layer 510, and the electron injection layer 520 are also not particularly limited. The materials commonly used for hole injection, hole transport, electron transport and electron injection in the art can be used, and can be selected accordingly by those skilled in the art according to the specific performance requirements of the display backboard and the specific materials of the light emitting layer 400, the first electrode 200, and the second electrode 600. Here, this will be omitted.

In summary, according to the embodiments of the present disclosure, the present disclosure proposes a display backboard, in which the first electrodes among the different sub-pixels are different in thickness and the light-emitting layers are also different in thickness, so that emission dipoles of different sub-pixels can be enabled to be disposed on the respective anti-nodes of standing wave, which results in effectively improving the light extraction efficiency of the display backboard and making other layers in the display backboard be uniform in thickness so as to be formed by a single process, thereby improving the complexity of the process and improving the device's luminous efficiency.

Figure 4:
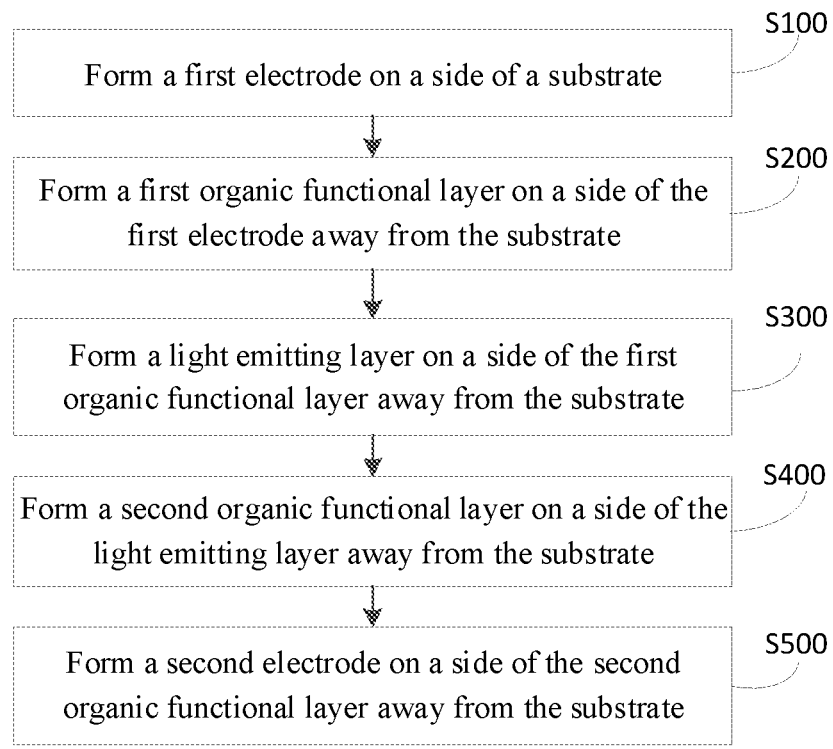
FIG. 4 is a flowchart illustrating a method for fabricating a display backboard according to an embodiment of the present disclosure.
Figure 5:
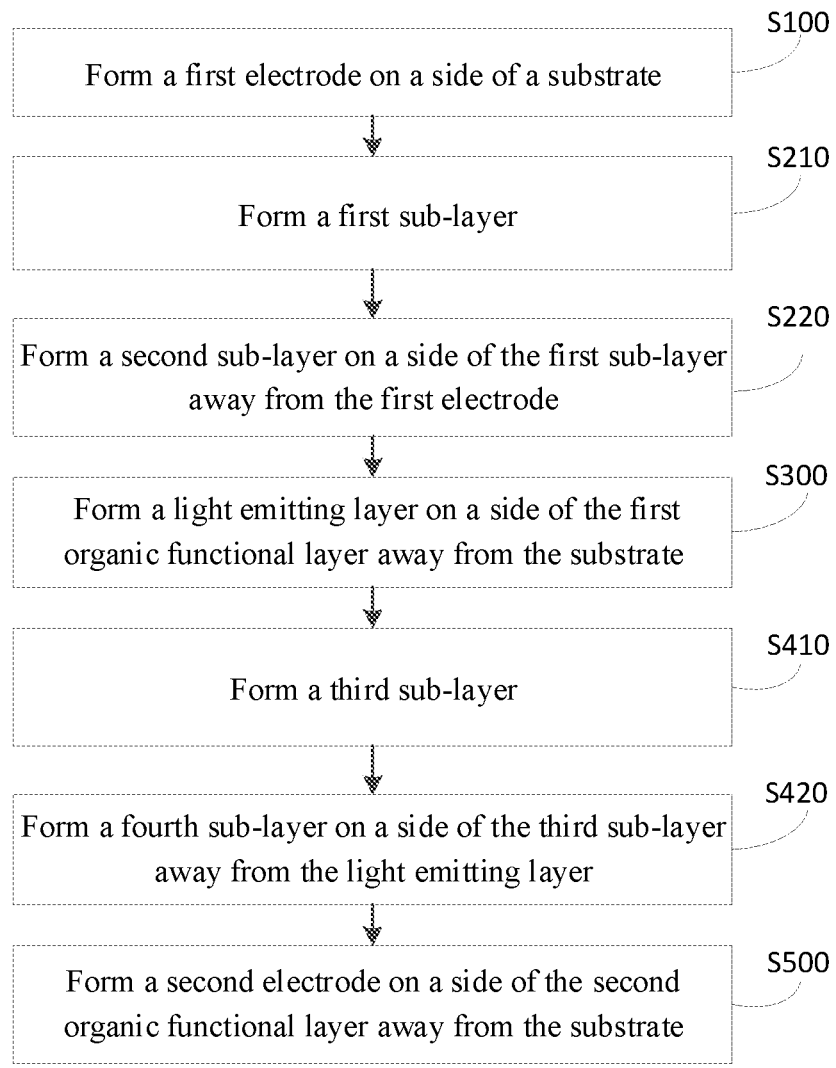
FIG. 5 is a flowchart illustrating a method for fabricating a display backboard according to another embodiment of the present disclosure.

In another aspect of the present disclosure, the present disclosure provides a method of fabricating a display backboard. Referring to FIGS. 4 to 5, the method of the present disclosure will be described in detail.

According to an embodiment of the present disclosure, the display backboard includes a plurality of pixel units arranged in an array, each pixel unit includes a plurality of sub-pixels which have different emission colors. Referring to FIG. 4, each sub-pixel is formed through the following steps.

S100: A first electrode is formed on one side of the substrate.

In this step, the first electrode 200 is formed on a side of the substrate 100. The plurality of first electrodes 200 among the plurality of sub-pixels are different in thickness.

According to an embodiment of the present disclosure, the plurality of the first electrodes 200 with different thicknesses among the plurality of the sub-pixels is formed by a single patterning process using a gray scale mask. Specifically, a first electrode material layer with a uniform thickness is formed on one side of the substrate 100, and then a pattern of the first electrode 200 with different thicknesses among different sub-pixels is etched by using a gray scale mask, so that the first electrode 200 with different thicknesses which is formed by a single patterning process can be realized by a gray scale mask, thereby, the complexity of the process can be reduced and the production cost can be reduced.

S200: A first organic functional layer is formed on a side of the first electrode away from the substrate.

In this step, the first organic functional layer 300 is formed on the side of the first electrode 200 away from the substrate 100.

According to the embodiments of the present disclosure, the specific method for forming the first organic functional layer 200 is not particularly limited, and can be designed accordingly by those skilled in the art according to the specific structure and material of the first organic functional layer 200. In some embodiments of the present disclosure, the first organic functional layer 200 may be formed by a solution method, and thus, the formed first organic functional layer 200 has a high material utilization and a low manufacturing cost.

According to an embodiment of the present disclosure, the specific thickness of the formed first organic functional layer 200 is not particularly limited, and can be designed and adjusted by those skilled in the art according to the total optical path that allows the emission dipoles of the respective sub-pixels of the display backboard to be placed at the second anti-node of standing wave condition on the first electrode side and the specific thickness of the first electrode 200. In some embodiments of the present disclosure, the plurality of first organic functional layers 200 among the plurality of sub-pixels may be the same in thickness. In this way, the first organic functional layer 200 with the same thickness may be obtained by a single solution method, and thus it can improve the complexity of the process and reduce the production cost. In addition, as described with reference to the foregoing embodiment of the present invention, in some embodiments, the steps for forming the first organic functional layer may be omitted.

In some embodiments of the present disclosure, referring to FIG. 5, step S200 may further include the following steps.

S210: A first sub-layer is formed.

In this step, a first sub-layer is formed on the side of the first electrode 200 away from the substrate 100, and the plurality of first sub-layers among the plurality of sub-pixels are the same in thickness.

In some embodiments of the present disclosure, the first sub-layer may be a hole injection layer (HIL) 310, so the hole injection layer 310 is formed by the solution method on the side of the first electrode 200 away from the substrate 100, and the plurality of hole injection layers 310 among the sub-pixels are the same in thickness. In this way, the hole injection layers 310 with the same thickness can be obtained by a single solution method, so that the process complexity can be improved and the production cost can be reduced. According to the embodiments of the present disclosure, the specific process parameters for forming the hole injection layer 310 with the solution method, such as the solvent type, concentration, or temperature, are not particularly limited, and can be selected accordingly by those skilled in the art according to the specific materials of the hole injection layer 310. In this regard, the present disclosure will omit here.

In other embodiments of the present disclosure, the first sub-layer may be an electron injection layer (EIL) and accordingly, the electron injection layer is formed by an evaporation method on the side of the first electrode 200 away from the substrate 100, and the plurality of electron injection layers among the plurality of sub-pixels are the same in thickness. In this way, the electron injection layers with the same thickness can be obtained by a single evaporation method, so that the process complexity can be improved and the production cost can be reduced.

S220: A second sub-layer is formed on a side of the first sub-layer away from the first electrode.

In this step, a second sub-layer is formed on the side of the first sub-layer away from the first electrode, and the plurality of second sub-layers among the plurality of sub-pixels are the same in thickness.

In some embodiments of the present disclosure, the first sub-layer may be a hole injection layer 310, and the second sub-layer may be a hole transport layer 320. Accordingly, the hole transport layer 320 is formed by the solution method on the side of the hole injection layer 310 away from the first electrode 200, and the plurality of hole transport layers 320 among the plurality of sub-pixels are the same in thickness. In this way, the hole transport layers 320 with the same thickness can be obtained by a single solution method, so that the complexity of the process can be improved and the production cost can be reduced. According to the embodiments of the present disclosure, the specific process parameters of the solution method for forming the hole transport layer 320, such as solvent type, concentration, or temperature, are not particularly limited, and can be selected accordingly by those skilled in the art according to the specific materials of the hole transport layer 320. In this regard, the present disclosure will omit here.

In other embodiments of the present disclosure, the first sub-layer may be an electron injection layer, and the second sub-layer may be an electron transport layer. Accordingly, the electron transport layer is formed by an evaporation method on the side of the electron injection layer away from the first electrode 200, and the plurality of electron transport layers among the plurality of sub-pixels are the same in thickness. In this way, the electron transport layers with the same thickness can be obtained by a single evaporation method, so that the process complexity can be improved and the production cost can be reduced.

S300: A light emitting layer is formed on the side of the first organic functional layer away from the substrate.

In this step, the light emitting layer 400 is formed on a side of the first organic functional layer 300 away from the substrate 100, and the plurality of light emitting layers 400 among the plurality of sub-pixels are not the same in thickness. The thickness of the first electrode 200 and the thickness of the light emitting layer 400 may enable the emission dipole of the sub-pixel to be placed at the second anti-node of standing-wave on the first electrode side.

According to the embodiments of the present disclosure, the specific method for forming the light emitting layer 400 is not particularly limited, and can be selected accordingly by those skilled in the art according to the specific design requirements of the display backboard and the specific materials of the light emitting layer 400. In some embodiments of the present disclosure, the light emitting layers 400 of different sub-pixels with different thicknesses may be formed by a solution method. Specifically, for a case where the plurality of sub-pixels include a red sub-pixel R, a green sub-pixel and a blue sub-pixel B, the three light-emitting layers 410, 420, and 430 with three different thickness may be formed by a single solution methods respectively. In this way, the emission dipoles of the different sub-pixels can be placed at the respective anti-nodes of standing wave only by respectively forming the first electrode 200 and the light emitting layer 400 with different thicknesses, and a display backboard with higher extraction efficiency can further be obtained.

S400: A second organic functional layer is formed on the side of the light emitting layer away from the substrate.

In this step, the second organic functional layer 500 is formed on the side of the light emitting layer 400 away from the substrate 100.

According to the embodiments of the present disclosure, the specific method for forming the second organic functional layer 500 is not particularly limited, and can be designed accordingly by those skilled in the art according to the specific structure and material of the second organic functional layer 500. In some embodiments of the present disclosure, the second organic functional layer 500 may be formed by an evaporation method.

According to an embodiment of the present disclosure, the specific thickness of the second organic functional layer 500 formed can be designed and adjusted accordingly by those skilled in the art according to the standing wave conditions on the second electrode sides of the emission dipoles of different sub-pixels of the display backboard and the specific electrical properties of the second organic functional layer 500. In some embodiments of the present disclosure, the plurality of second organic functional layers 500 in the plurality of sub-pixels may be the same in thickness. In this way, the second organic functional layers 500 with the same thickness can be obtained by a single evaporation method and this can improve the complexity of the process and reduce the production cost. In addition, as described with reference to the foregoing embodiment of the present invention, in some embodiments, the steps for forming the second organic functional layer may be omitted.

In some embodiments of the present disclosure, referring to FIG. 5, step S400 may further include the following steps.

S410: A third sub-layer is formed.

In this step, a third sub-layer is formed on the side of the light emitting layer away from the substrate, and the plurality of third sub-layers among the plurality of sub-pixels are the same in thickness.

In some embodiments of the present disclosure, the third sub-layer may be the electron transport layer 510. Accordingly, the electron transport layer 510 is formed by an evaporation method on the side of the light emitting layer 400 away from the substrate 100, and the plurality of electron transport layers 510 among the plurality of sub-pixels are the same in thickness. In this way, the electron transport layers 510 with the same thickness can be obtained by a single evaporation method, so that the process complexity can be reduced and the production cost can be reduced. According to the embodiment of the present disclosure, the specific process parameters of the evaporation method for forming the electron transport layer 510, such as the temperature and the time, are not particularly limited, and can be selected accordingly by those skilled in the art according to the specific materials of the electron transport layer 510. In this regard, the present disclosure will omit here.

In other embodiments of the present disclosure, the third sub-layer may be a hole transport layer. Accordingly, the hole transport layer is formed by a solution method on the side of the light emitting layer away from the substrate 100, and the plurality of hole transport layers among the plurality of sub-pixels are the same in thickness. In this way, the hole transport layers with the same thickness can be obtained by a single solution method, so that the complexity of the process can be reduced, and the production cost can be reduced.

S420: A fourth sub-layer is formed on a side of the third sub-layer away from the light-emitting layer.

In this step, the fourth sub-layer is formed on the side of the third sub-layer away from the light-emitting layer, and the plurality of fourth sub-layers among the plurality of sub-pixels are the same in thickness.

In some embodiments of the present disclosure, the third sub-layer may be an electron transport layer 510, and the fourth sub-layer may be an electron injection layer 520. Accordingly, the electron injection layer 520 is formed through an evaporation method on the side of the electron transport layer 510 away from the light-emitting layer 400, and the plurality of electron injection layers 520 among the plurality of sub-pixels are the same in thickness. In this way, the electron injection layers 520 with the same thickness can be obtained by a single evaporation method, so that the process complexity can be reduced and the production costs can be reduced. According to the embodiments of the present disclosure, specific process parameters, such as temperature and time, for forming the electron injection layer 520 by the evaporation method are not particularly limited, and can be selected accordingly by those skilled in the art according to the specific materials of the electron injection layer 520. In this regard, the present disclosure will omit here.

In other embodiments of the present disclosure, the third sub-layer may be a hole transport layer, and the fourth sub-layer may be a hole injection layer. Accordingly, the hole injection layer is formed by the solution method on the side of the hole transport layer away from the light-emitting layer 400, and the plurality of hole injection layers among the plurality of sub-pixels are the same in thickness. In this way, the hole injection layers with the same thickness can be obtained by a single solution method, so that the process complexity can be reduced and the production cost can be reduced.

S500: A second electrode is formed on a side of the second organic functional layer away from the substrate.

In this step, the second electrode is formed on the side of the second organic functional layer 500 away from the substrate 100. In this way, a display backboard structure with improved structure and function can be obtained.

According to the embodiments of the present disclosure, the specific method for forming the second electrode 600 is not particularly limited, and can be selected accordingly by those skilled in the art according to the specific material of the second electrode 600. In some embodiments of the present disclosure, the metal material second electrode 600 may be formed by deposition or sputtering for the display backboard with the bottom emitting mode. In this way, a device structure with a better microcavity resonance effect may be obtained.

According to embodiments of the present disclosure, the specific thickness of the second electrode 600 is not particularly limited, and can be designed and adjusted accordingly by those skilled in the art according to the specific electrical properties of the display backboard. In some embodiments of the present disclosure, the plurality of second electrodes 600 among the plurality of sub-pixels may be the same in thickness. In this way, the second electrode 200 with the same thickness can be manufactured through a single process, so that the process complexity can be reduced, and production cost can be reduced.

To sum up, according to embodiments of the present disclosure, the present disclosure provides a method for fabricating a display backboard, which can set emission dipoles of different sub-pixels on the respective the anti-nodes of standing wave by respectively forming the first electrodes and the light-emitting layers with different thicknesses, and this can obtain the display backboard with a higher extraction efficiency and the other layers in the backboard with the uniform thickness that are formed in a single process, thereby reducing the complexity of the manufacturing process and obtaining the display backboard with a better device luminous efficiency.

In another aspect of the present disclosure, the present disclosure provides a display device. According to an embodiment of the present disclosure, the display device includes the display backboard described above.

According to the embodiments of the present disclosure, the specific type of the display device is not particularly limited and any type commonly used in the art may be used, for example, an OLED display, etc. The type can be selected accordingly by those skilled in the art according to the specific use of the display device and the present disclosure will not repeat them here.

It should be noted that the display device includes other necessary components and structures in addition to the display backboard, and taking an OLED display as an example, the display device may include for example a cover plate, a frame, a circuit board, a casing, a power line, and the like. A person skilled in the art can add them according to the specific type of the display device, and this will not be described here.

In summary, according to the embodiments of the present disclosure, the present disclosure provides a display device, the display backboard of which has a better extraction efficiency and a better luminous efficiency, which results in a better display effect for the display device. It can be understood by those skilled in the art that the features and advantages described in the foregoing for the display backboard are still applicable to the display device, and are not described herein again.

In the description of the present disclosure, it should be understood that the orientation or positional relationship indicated by the terms such as "center", "longitudinal", "transverse", "length", "width", "thickness", "on", "under", "front", "rear", "left", "right", "vertical", "horizontal", "top", "bottom", "inner", "outer", "clockwise", "counter-clockwise", "axial", "radial", "circumferential" or the like is based on the orientation or positional relationship shown in the drawings and is for ease of description of the present disclosure and simplified description, and does not indicate or imply that the indicated device or the elements must have a particular orientation, and be constructed and operated in a particular orientation, and therefore should not be construed as limitations for the present disclosure.

Moreover, the terms "first", "second", "third", and "fourth" are used for descriptive purposes only and are not to be construed as indicating or implying a relative importance or implicitly indicating the number of indicated technical features. Thus, features defined as "first", "second", "third", and "fourth" may explicitly or implicitly include at least one such feature. In the description of the present disclosure, the meaning of "plurality" is at least two, such as two, three, etc., unless specifically defined otherwise.

In the description of the specification, the description indicated by the terms "one embodiment", "some embodiments", "an example", "a specific example", or "some examples" or the like means that a specific feature, structures, materials, or characteristics described in conjunction with the embodiment or example are included in at least one embodiment or example of the present disclosure. In this specification, the schematic representation of the above terms does not necessarily have to refer to the same embodiment or example. Furthermore, the particular features, structures, materials, or characteristics described may be combined in any suitable manner in any one or more of the embodiments or examples. In addition, those skilled in the art may combine the different embodiments or examples described in this specification and features of different embodiments or examples without conflicting with each other.

Although embodiments of the present disclosure have been shown and described above, it will be understood that the above embodiments are exemplary and not to be construed as limiting the present disclosure, and that those of ordinary skill in the art may make variations, modifications, substitutions and variants to the above described embodiments within the scope of the present disclosure.

What is claimed is:

1. A display backboard, comprising:
a base substrate;
a plurality of pixel units arranged in an array, each of the plurality of pixel units comprising a first sub-pixel and a second sub-pixel,
wherein the first sub-pixel comprises a first sub-pixel first electrode, a first light emitting layer, and a first sub-pixel second electrode stacked in sequence on the base substrate, and
the second sub-pixel comprises a second sub-pixel first electrode, a second light emitting layer, and a second sub-pixel second electrode stacked in sequence on the base substrate,
wherein the first sub-pixel and the second sub-pixel have different emission colors, and a thickness of the first sub-pixel first electrodes is different from a thickness of the second sub-pixel first electrode, and the thickness of the first sub-pixel first electrode is configured so that an emission dipole of the first sub-pixel is located at a second anti-node of a standing wave on the first sub-pixel first electrode, and the thickness of the second sub-pixel first electrode is configured so that an emission dipole of the second sub-pixel is located at a second anti-node of a standing wave on the second sub-pixel first electrode.

2. The display backboard according to claim 1, further comprising a third sub-pixel, wherein the third sub-pixel comprises a third sub-pixel first electrode, a third light emitting layer, and a third sub-pixel second electrode stacked in sequence on the base substrate, the third sub-pixel has different emission color from those of the first sub-pixel and the second sub-pixel, a thickness of the third sub-pixel first electrode is configured so that an emission dipole of the third sub-pixel is located at a second anti-node of a standing wave on the third sub-pixel first electrode.

3. The display backboard according to claim 2, further comprising:
 a first organic functional layer disposed between the first sub-pixel first electrode and the first light emitting layer; and
 a second organic functional layer disposed between the first sub-pixel second electrode and the first light emitting layer.

4. The display backboard according to claim 2, wherein the first sub-pixel is a red sub-pixel, and the thickness of the first sub-pixel first electrode is 135-145 nm;
 the second sub-pixel is a green sub-pixel, and the thickness of the second sub-pixel first electrode is 85-95 nm; and
 the third sub-pixel is a blue sub-pixel, and the thickness of the third sub-pixel first electrode is 65-75 nm.

5. The display backboard according to claim 4, wherein the first organic functional layer comprises a first sub-layer and a second sub-layer,
 the second sub-layer is disposed on a side of the first sub-layer away from the first sub-pixel first electrode.

6. The display backboard according to claim 4, further comprising a second organic functional layer comprising a third sub-layer and a fourth sub-layer,
 the fourth sub-layer is disposed on a side of the third sub-layer away from the first light emitting layer.

7. A display device, comprising the display backboard according to claim 1.

8. A method for fabricating a display backboard, the display backboard comprising a plurality of pixel units arranged in an array, each of the plurality of pixel units comprising a first sub-pixel and a second sub-pixel being formed by the following steps:
 forming, on a side of a base substrate, a first sub-pixel first electrode and a second sub-pixel first electrode;
 forming, on a side of the first sub-pixel first electrode away from the base substrate, a first light emitting layer, and forming, on a side of the second sub-pixel first electrode away from the base substrate, a second light emitting layer; and
 forming, on a side of the first light emitting layer away from the substrate, a first sub-pixel second electrode, and forming on a side of the second light emitting layer away from the substrate, a second sub-pixel second electrode,
 wherein the first sub-pixel and the second sub-pixel have different emission colors, and a thickness of the first sub-pixel first electrode is different from a thickness of the second sub-pixel first electrode, and the thickness of the first sub-pixel first electrode is configured so that an emission dipole of the first sub-pixel is located at a second anti-node of a standing wave on the first sub-pixel first electrode side, and the thickness of the second sub-pixel first electrode is configured so that an emission dipole of the second sub-pixel is located at a second anti-node of a standing wave on the second sub-pixel first electrode side.

9. The method according to claim 8, wherein the first sub-pixel first electrode and the second sub-pixel first electrode are formed by a single patterning process using a gray scale mask.

10. The method according to claim 8, wherein the steps for forming the first light emitting layer comprise:
 forming, on a side of the first sub-pixel first electrode away from the base substrate, a first organic functional layer; and
 forming, on a side of the first organic functional layer away from the base substrate, the first light emitting layer.

11. The method according to claim 10, wherein the first organic functional layer and the first light emitting layer are formed by a solution method.

12. The method according to claim 10, wherein the steps for forming the first organic functional layer comprises:
 forming a first sub-layer on the side of the first sub-pixel first electrode away from the base substrate;
 forming a second sub-layer, on a side of the first sub-layer away from the first sub-pixel first electrode.

13. The method according to claim 8, wherein the steps for forming the first sub-pixel second electrode comprise:
 forming, on a side of the first light emitting layer away from the base substrate, a second organic functional layer; and
 forming, on a side of the second organic functional layer away from the base substrate, the first sub-pixel second electrode.

14. The method according to claim 13, wherein the steps for forming the second organic functional layers comprises:
 forming a third sub-layer on the side of the first light emitting layer away from the base substrate; and
 forming a fourth sub-layer on a side of the third sub-layer away from the first light emitting layer.

* * * * *